United States Patent [19]

Togashi et al.

[11] Patent Number: 4,772,932
[45] Date of Patent: Sep. 20, 1988

[54] BIPOLAR TRANSISTOR AND INCLUDING GAS LAYERS BETWEEN THE EMITTER AND BASE AND THE BASE AND COLLECTOR

[75] Inventors: Kou Togashi; Yoji Kato, both of Kanagawa, Japan

[73] Assignee: Sony Corporation, Tokyo, Japan

[21] Appl. No.: 812,377

[22] Filed: Dec. 23, 1985

[30] Foreign Application Priority Data

Dec. 25, 1984 [JP] Japan .................. 59-277893

[51] Int. Cl.⁴ .............. H01L 29/161; H01L 29/72; H01L 29/205
[52] U.S. Cl. .................. 357/35; 357/16; 357/22; 357/34; 357/61
[58] Field of Search .......... 357/16, 34, 35, 61, 357/22 A, 22 MD, 22 G

[56] References Cited

FOREIGN PATENT DOCUMENTS 58-93380  6/1983  Japan ............... 357/22 MD
231362  11/1985  Japan ............... 357/16

Primary Examiner—James J. Carroll
Assistant Examiner—Ngan Ngo

[57] ABSTRACT

A semiconductor device according to the invention comprises: a first semiconductor layer having a low impurity concentration formed on a semiconductor substrate; a second semiconductor layer of a first conductivity type formed on the first semiconductor layer and forming a heterojunction therewith; an emitter region and a collector region formed in the first and second semiconductor layers; and a semiconductor region of a second conductivity type formed in at least the second semiconductor layer between the emitter region and the collector region, wherein two-dimensional electron gas layers, induced in portions of the first semiconductor layer adjacent to the heterojunction and between the emitter region and the semiconductor region and between the collector region and the semiconductor region, are used as current paths, and a virtual base region is formed in the first semiconductor layer below the semiconductor region by majority carriers injected from the semiconductor region into the first semiconductor layer by forward biasing the emitter region and the semiconductor region, thereby enabling a bipolar transistor operation with two dimensional electron gas layers.

6 Claims, 2 Drawing Sheets

BIPOLAR TRANSISTOR AND INCLUDING GAS LAYERS BETWEEN THE EMITTER AND BASE AND THE BASE AND COLLECTOR

BACKGROUND OF THE INVENTION

1. Field of the Invention

The present invention relates to a semiconductor device and, more particularly, to a semiconductor device operated in a bipolar transistor mode.

2. Description of the Prior Art

A conventional GaAs lateral bipolar transistor is described, for example, in the Proceedings of the 45th Meeting on Japan Society of Applied Physics, Lecture No. 15a-H-9 (1984). In this GaAs lateral bipolar transistor, an n-type emitter region 2 and an n-type collector region 3 are buried in a semi-insulating GaAs substrate 1 at a predetermined distance, as shown in FIG. 1. A p-type region 4 (hole injector) is formed in the GaAs substrate 1 between the emitter region 2 and the collector region 3. An $Si_3N_4$ film 5 as a passivation film is formed on the GaAs substrate 1. An emitter electrode 6, a base electrode 7, and a collector electrode 8 are formed through openings 5a to 5c of the $Si_3N_4$ film 5, respectively.

In the GaAs lateral bipolar transistor shown in FIG. 1, when a forward bias voltage is applied between the emitter region 2 and the p-type region 4, a virtual base region 9 is formed by holes (majority carriers) injected from the p-type region 4 into the GaAs substrate 1. The virtual base region 9 accelerates injection of electrons from the emitter region 2 into the GaAs substrate 1. Thus, the bipolar transistor operation is enabled so that the injected electrons reach the collector region 3 through the virtual base region 9, as indicated by arrow A.

The conventional GaAs lateral bipolar transistor shown in FIG. 1 has the following drawbacks. First, it is difficult to sufficiently increase a DC current gain $h_{FE}$ because of a large recombination current caused by recombination at defects present on a surface 1a of the GaAs substrate 1 between the emitter region 2 and the p-type region 4. Secondly, since a lateral structure is adopted, distance between the virtual base region 9 and the collector region 3 is large. For this reason, since an electron recombination rate in a bulk (the GaAs substrate 1) is high, the recombination current also flows in the bulk. Thirdly, transistor characteristics vary widely because of variations in distance between the emitter region 2 and the p-type region 4. Fourthly, if a different GaAs substrate 1 is used, since influence of trap differs, the transistor characteristics may vary widely in accordance with the GaAs substrate used.

OBJECT AND SUMMARY OF THE INVENTION

It is an object of the present invention to provide a semiconductor device which is free from the above-mentioned drawbacks in the prior art.

A semiconductor device according to the present invention, comprises: a first semiconductor layer having a low impurity concentration formed on a semiconductor substrate; a second semiconductor layer of a first conductivity type formed on the first semiconductor layer and forming a heterojunction therewith; an emitter region and a collector region formed in the first and second semiconductor layers; and a semiconductor region of a second conductivity type formed in at least the second semiconductor layer, between the emitter region and the collector region, wherein two-dimensional electron gas layers, induced in a portion of the first semiconductor layer adjacent to the heterojunction and between the emitter region and the semiconductor region and between the collector region and the semiconductor region, are used as current paths, and a virtual base region is formed in the first semiconductor layer below the semiconductor region by majority carriers injected from the semiconductor region into the first semiconductor layer by forward biasing the emitter region and the semiconductor region, thereby enabling a bipolar transistor operation.

With the above structure, the two-dimensional electron gas layers are present in portions of the first semiconductor layer adjacent to the heterojunction, and serve as current paths between the emitter and base and between the base and collector. With this structure, a high-speed semiconductor device can be obtained, and a current gain can be set to be higher than that of a conventional device because almost no recombination current on the surface of the second semiconductor layer or in the semiconductor substrate occurs. In addition, characteristics of the semiconductor device will not change because of variations in distance between the emitter and base. Furthermore, parasitic resistance between the emitter and base and between the base and collector can be set to be very low when compared with the conventional device.

DETAILED DESCRIPTION OF THE PREFERRED EMBODIMENT

A semiconductor device according to an embodiment of the present invention will be described with reference to the accompanying drawings.

A manufacturing method of the semiconductor device according to this embodiment will now be described.

Figure 1:
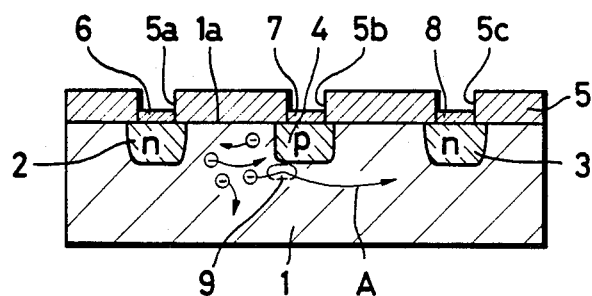
FIG. 1 is a sectional view of a conventional GaAs lateral bipolar transistor.
Figure 2A:
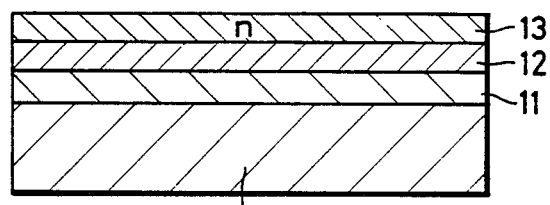
FIGS. 2A to 2F are sectional views sequentially showing a manufacturing method of a semiconductor device according to an embodiment of the present invention.

As shown in FIG. 2A, an undoped $Al_xGa_{1-x}As$ (x=0.3) layer 11, an undoped GaAs layer 12, and an n-type $Al_xGa_{1-x}As$ (x=0.3) layer 13, in which a predetermined amount of n-type impurity is doped, are sequentially epitaxially grown on a semi-insulating GaAs substrate 1 by, e.g., an MBE or an MOCVD method.

Figure 2B:
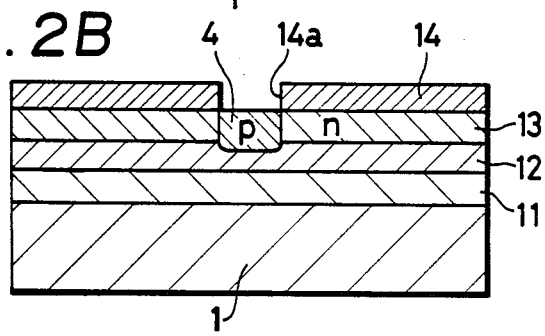

An $Si_3N_4$ film 14 is then deposited on the n-type $Al_xGa_{1-x}As$(x=0.3) layer 13 by, e.g., a CVD method, as shown in FIG. 2B. Subsequently, an opening 14a is formed in the $Si_3N_4$ film 14, and thereafter, p-type impurities (e.g., Zn) are thermally diffused through the opening 14a, forming a p-type region 4 which reaches the GaAs layer 12.

Figure 2C:
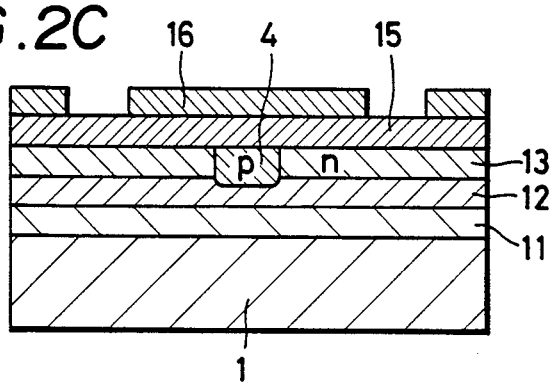

After the $Si_3N_4$ film 14 is removed, another $Si_3N_4$ film 15 is deposited on the n-type $Al_xGa_{1-x}As$ layer 13, as shown in FIG. 2C. A photoresist 16 of a predetermined pattern is then formed on the $Si_3N_4$ film 15.

Figure 2D:
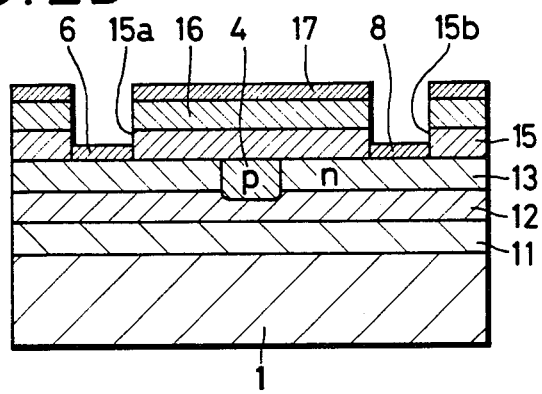

The $Si_3N_4$ film 15 is selectively etched using the photoresist 16 as a mask so as to form openings 15a and 15b, as shown in FIG. 2D. Thereafter, Au-Ge/Ni is deposited on the entire surface of the structure in the form of an Au-Ge/Ni film 17, thus forming an emitter electrode 6 and a collector electrode 8 of Au-Ge/Ni. The Au-Ge/Ni film 17 formed on the photoresist 16 is removed therewith by a lift-off method.

Figure 2E:
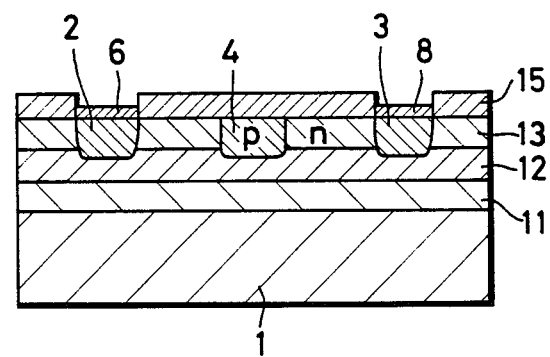

The resultant structure is subjected to a predetermined heat (alloy) process, so that the Au-Ge/Ni film forming the emitter electrode 6 and the collector electrode 8, are alloyed with the n-type $Al_xGa_{1-x}As$ layer 13 and the GaAs layer 12, thereby forming an emitter region 2 and a collector region 3, which comprise the alloy layers, as shown in FIG. 2E.

Figure 2F:
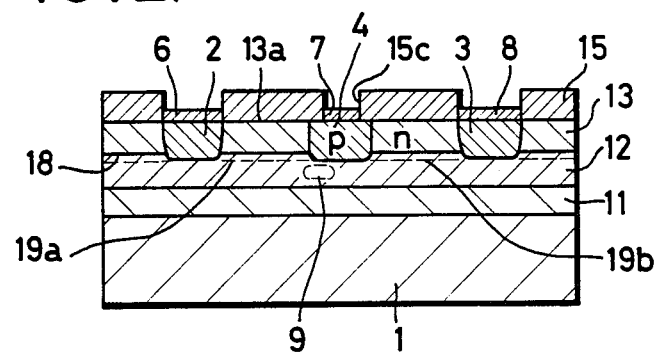

As shown in FIG. 2F, after an opening 15c is formed in the $Si_3N_4$ film 15, a base electrode 7 of Ti/Pt/Au is deposited on the p-type region 4 through the opening 15c in the same manner as the emitter electrode 6 and the collector electrode 8, thus completing the semiconductor device of this embodiment.

In the semiconductor device of FIG. 2F according to this embodiment, two-dimensional electron gas layers 19a and 19b are induced between the emitter region 2 and the p-type region 4 and between the collector region 3 and the p-type region 4 of the GaAs layer 12 adjacent to a heterojunction 18 between the GaAs layer 12 and the n-type $Al_xGa_{1-x}As$ layer 13. The two-dimensional electron gas layers 19a and 19b act as current paths between the emitter region 2 and the p-type region 4, and between the p-type region 4 and the collector region 3. More specifically, when a forward bias voltage is applied between the emitter region 2 and the p-type region 4, i.e., between the two-dimensional electron gas layer 19a and the p-type region 4, holes are injected from the p-type region 4 into the GaAs layer 12, and a virtual base region 9 is thus formed in the GaAs layer 12 below the p-type region 4. Electrons supplied from the emitter region 2 into the two-dimensional electron gas layer 19a migrate to the p-type region 4 through the two-dimensional electron gas layer 19a, and subsequently migrate to the two-dimensional electron gas layer 19b through the virtual base region 9. A reverse bias voltage is continuously applied between the two-dimensional electron gas layer 19b and the collector region 3 and electrons migrated into the two-dimensional electron gas layer 19b subsequently reach the collector region 3 through the two-dimensional electron gas layer 19b, thus enabling a bipolar transistor operation.

According to the above-mentioned embodiment, the GaAs layer 12 and the n-type $Al_xGa_{1-x}As$ layer 13 are sequentially formed on the $Al_xGa_{1-x}As$ layer 11, and the p-type region 4, the emitter region 2, and the collector region 3 are formed in the n-type $Al_xGa_{1-x}As$ layer 13 and the GaAs layer 12, thus providing the following advantages. Since the two-dimensional electron gas layers 19a and 19b are present in the GaAs layer 12, adjacent to the heterojunction 18, between the emitter region 2 and the p-type region 4, and between the p-type region 4 and the collector region 3, these layers 19a and 19b act as the current paths between the emitter region 2 and the p-type region 4, and between the collector region 3 and the p-type region 4. Since electron mobility in the two-dimensional electron gas layers 19a and 19b is extremely high, a semiconductor device operated in a bipolar transistor mode with higher operation speed than that of the conventional device can be provided. Furthermore, since an electron mobile region is restricted to the two-dimensional electron gas layer 19a between the emitter region 2 and the p-type region 4, electrons supplied from the emitter region 2 are prevented from being recombined on a surface 13a of the n-type $Al_xGa_{1-x}As$ layer 13, thus improving a gain $h_{FE}$ when compared with the conventional device.

As described above, since the electron mobile region is restricted to the two-dimensional electron gas layer 19a, if distance between the emitter region 2 and the p-type region 4 varies, transistor characteristics will not change. In addition, since a potential barrier of $\Delta E_c/q = 0.3$ V ($\Delta E_c$: a difference between conduction band edges $E_c$ of the n-type $Al_xGa_{1-x}As$ layer 13 and the GaAs layer 12 at the heterojunction 18) is present at the heterojunction 18, electrons from the emitter region 2 are prevented from migrating into the GaAs substrate 1. Therefore, a recombination current in the bulk can be decreased to substantially 0. Furthermore, since electron migration into the GaAs substrate 1 is prevented as described above, if distance between the virtual base region 9 and the collector region 3 is large, the recombination current will not flow in the bulk, and the characteristics of the semiconductor device will not be influenced by the use of different GaAs substrates 1.

Furthermore, since the two-dimensional electron gas layers 19a and 19b are present between the emitter region 2 and the p-type region 4 and between the p-type region 4 and the collector region 3, parasitic resistance is very small when compared with the conventional device.

The embodiment of the present invention has been described above. However, the present invention is not limitd to the above embodiment, and various changes and modifications may be made within the spirit and scope of the invention. For example, a composition ratio x of the $Al_xGa_{1-x}As$ layer 11 and the n-type $Al_xGa_{1-x}As$ layer 13 is 0.3. However, this ratio is not limited to 0.3, but can be a value other than 0.3. Furthermore, an InP substrate, a GaInAs layer, and an $Al_xIn_{1-x}As$ layer can be used respectively in place of the GaAs substrate 1, the GaAs layer 2 and the n-type $Al_xGa_{1-x}As$ layer 13, as needed. In the above embodiment, no impurity is doped in the GaAs layer 2 and the $Al_xGa_{1-x}As$ layer 11. However, they can be of a low impurity concentration, as needed. The $Al_xGa_{1-x}As$ layer 11 can be omitted, if desired. In the above embodiment, the p-type region 4 is formed by a thermal diffusion method, but can be formed by an ion-implantation method.

What is claimed is:

1. A semiconductor device comprising: a first semiconductor layer having a low impurity concentration formed on a semiconductor substrate; a second semiconductor layer of a first conductivity type formed on said first semiconductor layer and forming a heterojunction therewith; an emitter region and a collector region formed in said first and second semiconductor layers; and a semiconductor region of a second conductivity type formed in at least said second semiconductor layer between said emitter region and said collector region, wherein two-dimensional electron gas layers, induced in portions of said first semiconductor layer adjacent to said heterojunction and between said emitter region and said semiconductor region and between said collector region and said semiconductor region, are used as current paths, and a virtual base region is formed in said first semiconductor layer below said semiconductor region by majority carriers injected from said semiconductor region into said first semiconductor layer by forward biasing said emitter region and said semiconductor region, thereby enabling a bipolar transistor operation.

2. A semiconductor device according to claim 1, wherein said first semiconductor layer is an undoped GaAs layer and said second semiconductor layer is an n-type $Al_xGa_{1-x}As$ layer.

3. A semiconductor device according to claim 2, wherein a composition ratio x of said n-type $Al_xGa_{1-x}As$ layer is 0.3.

4. A semiconductor device according to claim 1 or 2 or 3, wherein said emitter region and said collector region comprise alloy layers.

5. A semiconductor device according to claim 2 or 3, wherein an $Al_xGa_{1-x}As$ layer is provided between said semiconductor substrate and said GaAs layer.

6. A semiconductor device according to claim 1 or 2 or 3, wherein said semiconductor substrate is a GaAs substrate.

* * * * *